(12) United States Patent
Brillhart et al.

(10) Patent No.: US 12,300,474 B2
(45) Date of Patent: May 13, 2025

(54) SEMICONDUCTOR SUBSTRATE SUPPORT POWER TRANSMISSION COMPONENTS

(71) Applicant: Applied Materials, Inc., Santa Clara, CA (US)

(72) Inventors: Paul L. Brillhart, Pleasanton, CA (US); Jian Li, Fremont, CA (US); Katherine Woo, Santa Clara, CA (US); Matthew Miller, Newark, CA (US); Shinnosuke Kawaguchi, Adachi-Ku (JP)

(73) Assignee: Applied Materials, Inc., Santa Clara, CA (US)

( * ) Notice: Subject to any disclaimer, the term of this patent is extended or adjusted under 35 U.S.C. 154(b) by 800 days.

(21) Appl. No.: 17/071,515

(22) Filed: Oct. 15, 2020

(65) Prior Publication Data

US 2022/0122817 A1 Apr. 21, 2022

(51) Int. Cl.
*H01J 37/32* (2006.01)
*C23C 14/50* (2006.01)
*C23C 16/458* (2006.01)

(52) U.S. Cl.
CPC ........ *H01J 37/32724* (2013.01); *C23C 14/50* (2013.01); *C23C 16/4586* (2013.01); *H01J 2237/332* (2013.01)

(58) Field of Classification Search
CPC ................ C23C 14/50; C23C 16/4586; H01J 37/32724; H01J 2237/332
USPC ........................................................ 361/234
See application file for complete search history.

(56) References Cited

U.S. PATENT DOCUMENTS

| 6,538,872 | B1 | 3/2003 | Wang et al. |
| 2009/0277895 | A1* | 11/2009 | Komatsu ............. C23C 16/4586 108/50.02 |
| 2012/0250211 | A1* | 10/2012 | Kida ................... H01L 21/6833 361/234 |

(Continued)

FOREIGN PATENT DOCUMENTS

| JP | 2008-198975 A | 8/2008 |
| JP | 2016-143795 A | 8/2016 |

(Continued)

OTHER PUBLICATIONS

Wikipedia "Copper-tungsten" https://web.archive.org/web/20161006024445/https://en.wikipedia.org/wiki/Copper%E2%80%93tungsten Oct. 6, 2016 (Year: 2016).*

(Continued)

*Primary Examiner* — Kevin J Comber
(74) *Attorney, Agent, or Firm* — Kilpatrick Townsend & Stockton LLP

(57) ABSTRACT

Exemplary support assemblies may include an electrostatic chuck body defining a substrate support surface. The assemblies may include a support stem coupled with the electrostatic chuck body. The assemblies may include a heater embedded within the electrostatic chuck body. The assemblies may include an electrode embedded within the electrostatic chuck body between the heater and the substrate support surface. The assemblies may include a power transmission rod coupled with the electrode. The power transmission rod may include a material characterized by a coefficient of thermal expansion of less than or about $10 \times 10^{-6}$/° C.

16 Claims, 4 Drawing Sheets

(56) References Cited

U.S. PATENT DOCUMENTS

2018/0053678 A1* 2/2018 Kugimoto ......... H01L 21/67103
2018/0174878 A1* 6/2018 Kimura ............... H01L 21/3065

FOREIGN PATENT DOCUMENTS

| JP | 2016-171185 A | 9/2016 |
| JP | 2017-163157 A | 9/2017 |
| TW | 200842973 A | 11/2008 |

OTHER PUBLICATIONS

Vbcgroup "Active Braze Alloys and their Applications" https://web.archive.org/web/20190612133302/https://www.vbcgroup.com/technical-news/active-braze-alloys-and-their-applications/ (Year: 2019).*
International Search Report and Written Opinion mailed Jan. 25, 2022 in International Patent Application No. PCT/US2021/053061, 8 pages.

* cited by examiner

SEMICONDUCTOR SUBSTRATE SUPPORT POWER TRANSMISSION COMPONENTS

TECHNICAL FIELD

The present technology relates to components and apparatuses for semiconductor manufacturing. More specifically, the present technology relates to substrate support assembly components and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. The substrate support may also be utilized in some technologies to develop a substrate-level plasma.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

SUMMARY

Exemplary support assemblies may include an electrostatic chuck body defining a substrate support surface. The assemblies may include a support stem coupled with the electrostatic chuck body. The assemblies may include a heater embedded within the electrostatic chuck body. The assemblies may include an electrode embedded within the electrostatic chuck body between the heater and the substrate support surface. The assemblies may include a power transmission rod coupled with the electrode. The power transmission rod may include a material characterized by a coefficient of thermal expansion of less than or about $10 \times 10^{-6}/°$ C.

In some embodiments, the power transmission rod may be characterized by a room temperature resistivity of less than or about $15 \times 10^{-8}$ Ω-m. The power transmission rod may be or include a refractory metal or a refractory metal alloy. The refractory metal may be or include tantalum. The refractory metal may be or include tungsten. The refractory metal may be or include a tungsten-copper alloy. The tungsten-copper alloy may be characterized by a copper concentration of less than or about 50%. The assemblies may include a terminal coupling the power transmission rod with the electrode. The terminal may be or include molybdenum. The assemblies may include an eyelet forming a receptacle for the power transmission rod. The eyelet may be seated against the terminal. The eyelet may be formed of a similar material as the power transmission rod. The assemblies may include a brazing material joining the power transmission rod with the eyelet. The brazing material may be or include an alloy including one or more Group 4 or Group 5 metals.

Embodiments of the present technology may encompass substrate support assemblies. The assemblies may include a support body defining a substrate support surface. The assemblies may include a heater embedded within the support body. The assemblies may include an electrode embedded within the support body. The assemblies may include a power transmission rod comprising tantalum or tungsten. The assemblies may include a terminal coupling the power transmission rod with the electrode.

In some embodiments, the terminal may be or include molybdenum. The power transmission rod may be or include a material characterized by a coefficient of thermal expansion of less than or about $10 \times 10^{-6}/°$ C. The power transmission rod may be characterized by a room temperature resistivity of less than or about $15 \times 10^{-8}$ Ω-m. The power transmission rod may be or include a tungsten-copper alloy. The tungsten-copper alloy may be characterized by a copper concentration of less than or about 50%. The assemblies may include an eyelet forming a receptacle for the power transmission rod. The eyelet may be seated against the terminal. The eyelet may be formed of a similar material as the power transmission rod. The assemblies may include a brazing material joining the power transmission rod with the eyelet. The brazing material may be or include an alloy including one or more Group 4 or Group 5 metals.

Some embodiments of the present technology may encompass substrate support assemblies. The assemblies may include an electrostatic chuck body defining a substrate support surface. The assemblies may include a heater embedded within the electrostatic chuck body. The assemblies may include an electrode embedded within the electrostatic chuck body. The assemblies may include a power transmission rod comprising tantalum or a tungsten-copper alloy. In some embodiments, the power transmission rod may be or include a material characterized by a coefficient of thermal expansion of less than or about $7 \times 10^{-6}/°$ C.

Such technology may provide numerous benefits over conventional systems and techniques. For example, embodiments of the present technology may provide substrate supports that may remain sustainable during high-temperature operations. Additionally, by utilizing improved materials within the substrate support, improved process uniformity may be afforded. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
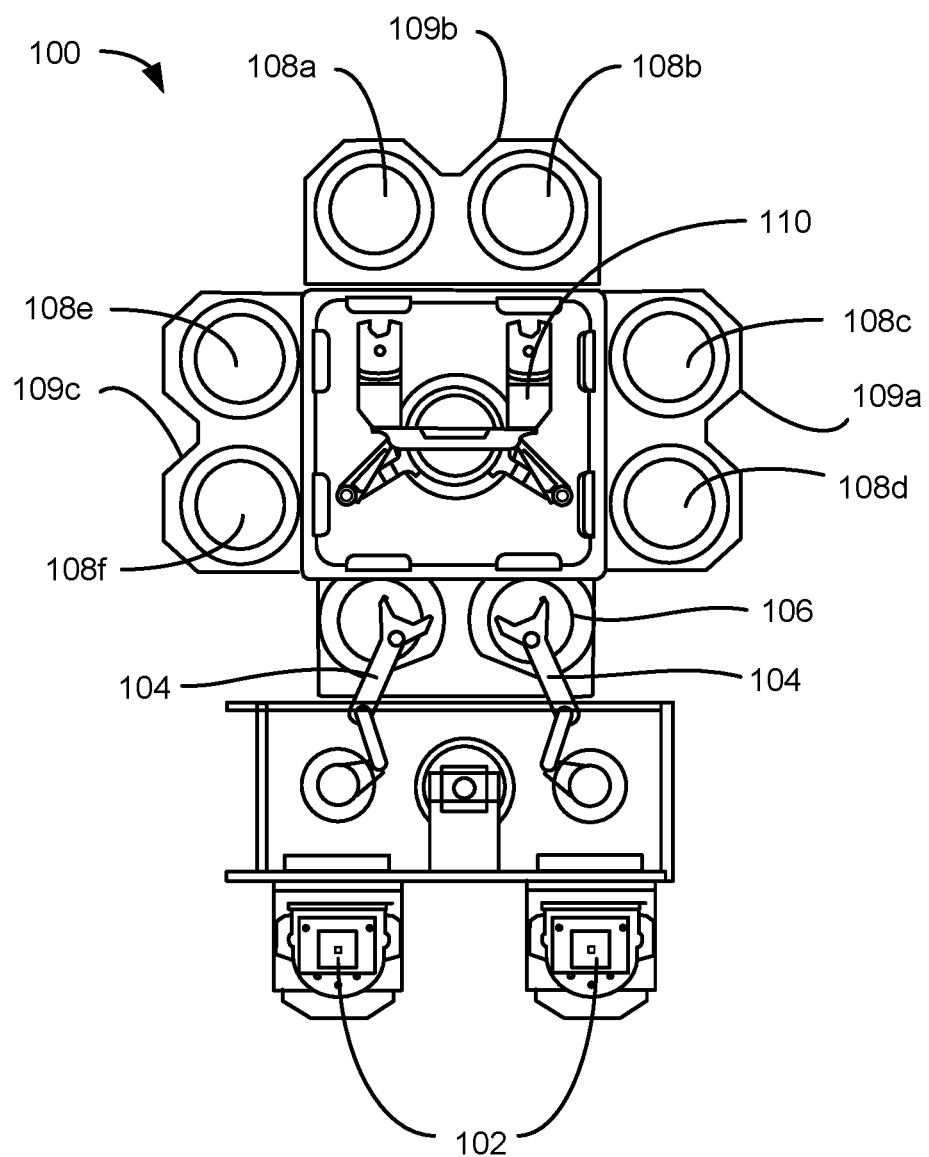
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. A substrate support, which may be or include an electrostatic chuck, may be used to seat a substrate, and may produce a clamping action with the substrate to maintain the substrate in place. Additionally, the substrate support may be used to maintain or tune a plasma generated between the substrate support and a faceplate. An RF power source may be included with an electrode embedded within the substrate support to supply current to the electrode during operations. Additionally, many films may be developed at relatively high temperatures that further affect components of the chamber. For example, some deposition activities may occur at temperatures above 500° C. or higher, which may affect the electrical properties of chamber components, such as the materials of the electrostatic chuck.

Many conventional substrate supports may use nickel as a component coupled with an electrode within a substrate support platen. Nickel may pose issues with processing that may be exacerbated by increased processing temperature. For example, nickel may oxidize when exposed to atmosphere. RF power may be transmitted along a surface of a supply rod based on a skin depth at a particular temperature, and thus may travel along a few dozen micrometers or less thickness of the component. When this exterior oxidizes, the resistance of the material increases, which may increase heat generation along the rod. Where the rod couples with an electrode may develop a hot spot within the substrate support, which may cause uniformity issues by increasing a surface temperature proximate the supply rod. Additionally, nickel may be characterized by a relatively high coefficient of thermal expansion, which may increase stress within the substrate support during high temperature operations, and which may lead to cracking or damage to the substrate support. Finally, nickel is magnetic, which may cause the skin depth to undergo a change in permeability due to magnetism causing an unstable process around the Curie temperature of the rod, which may be less than or about 360° C. for nickel.

The present technology overcomes these challenges with substrate support assemblies incorporating nonmagnetic power supply rods, which may include materials characterized by a closer match in coefficient of thermal expansion with surrounding materials. By utilizing materials and components according to some embodiments of the present technology, structural integrity of the substrate support may be improved at increased processing temperatures. Additionally, process uniformity may be improved by reducing hot spot generation within the substrate support where the supply rod is located.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include pedestals or components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
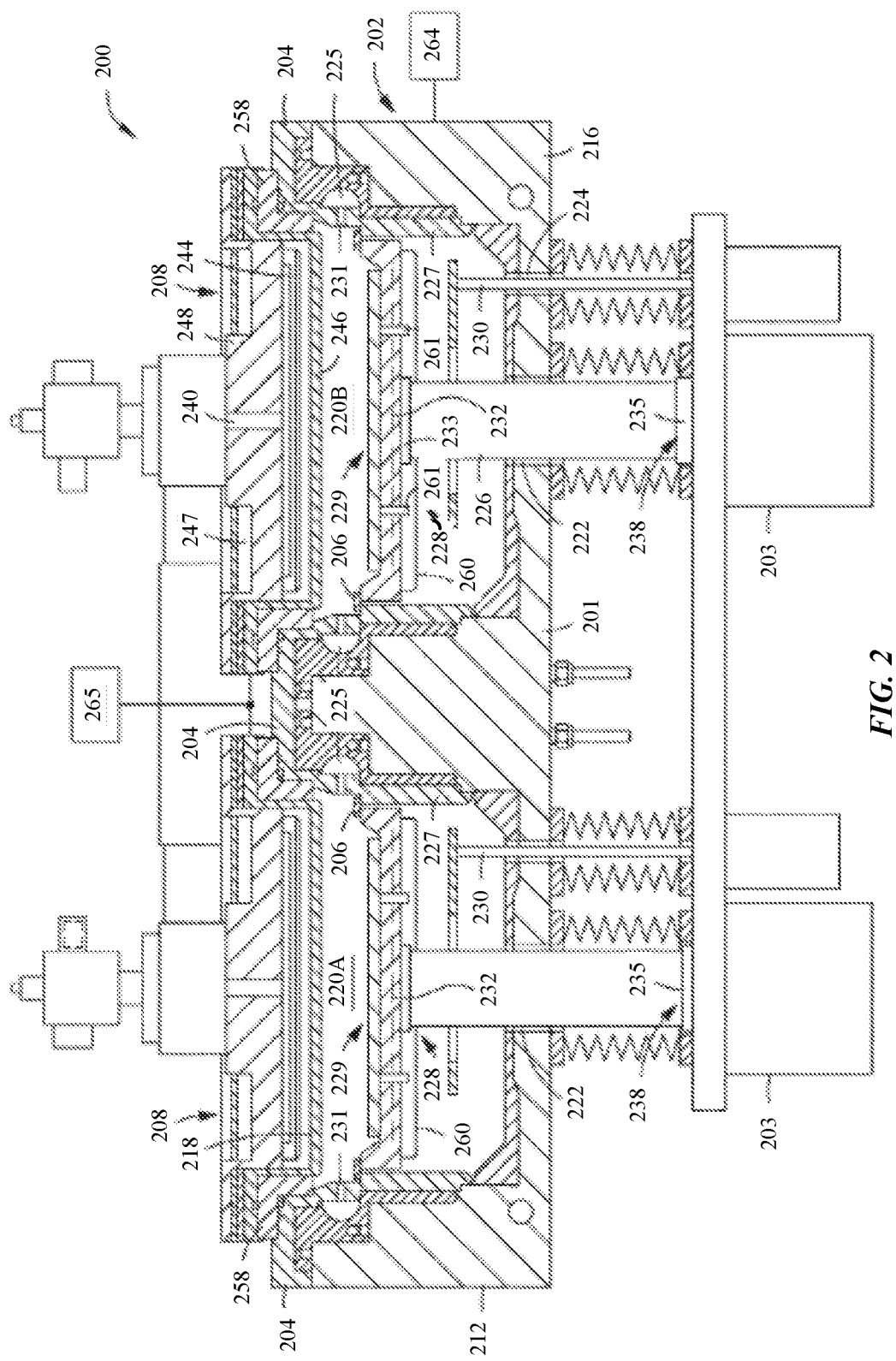
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
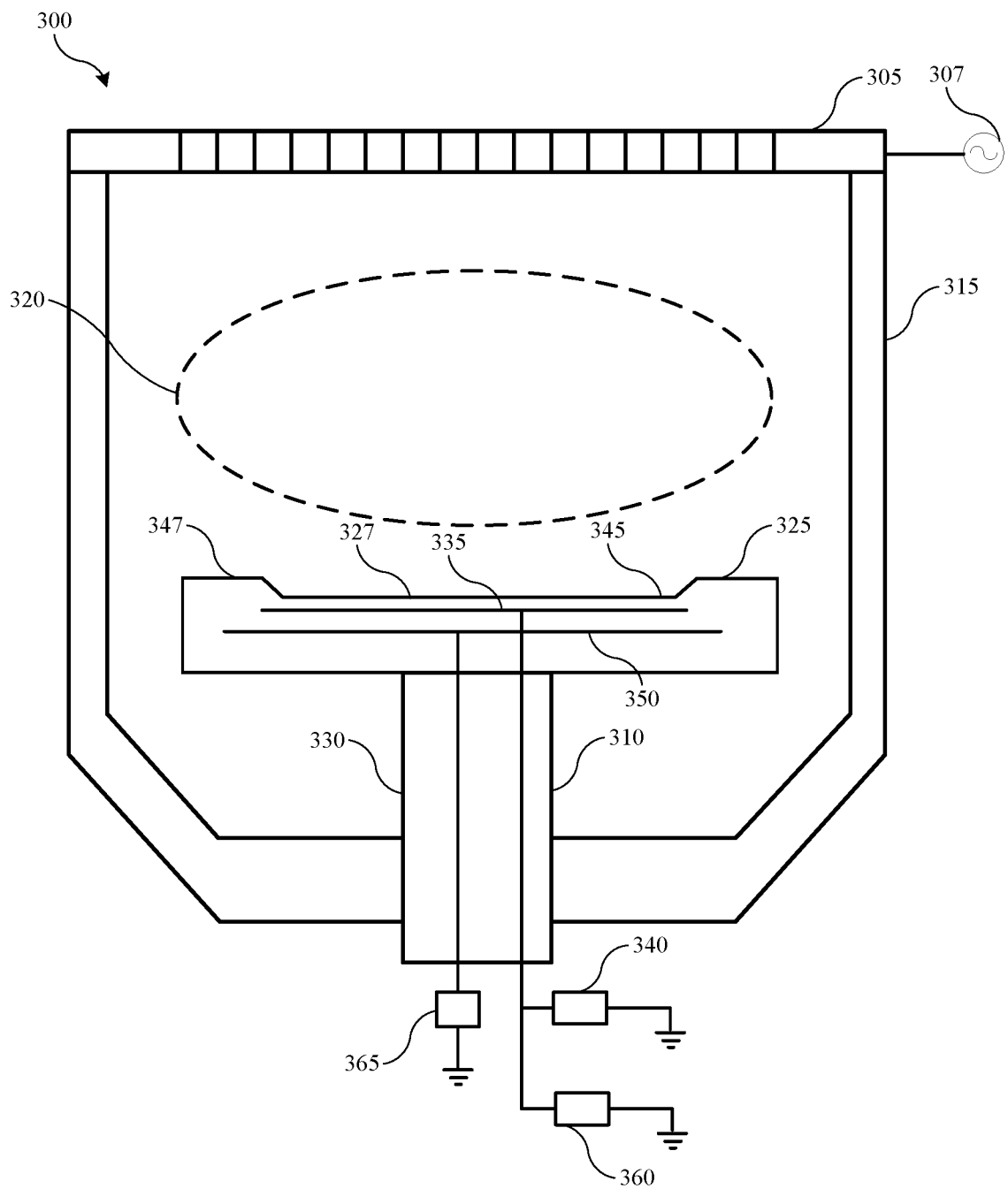
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels as will be discussed below for delivering and receiving electrical and/or fluid lines that may couple with internal components of the chuck body 325, including for providing a purge gas along the power transmission rod or other components. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include an electrode 335 embedded within the chuck body proximate the substrate support surface. Electrode 335 may be electrically coupled with a power source 340, which may be an RF power supply. Power source 340 may be configured to provide energy or voltage to the electrically conductive chuck electrode 335. This may be operated to form a plasma of a precursor within the processing region 320 of the semiconductor processing chamber 300, although other plasma operations may similarly be sustained. For example, electrode 335 may also be a chucking mesh that operates as electrical ground for a capacitive plasma system including an RF source 307 electrically coupled with showerhead 305. For example, electrode 335 may operate as a ground path for RF power from the RF source 307, while also operating as an electrical bias to the substrate to provide electrostatic clamping of the substrate to the substrate support surface. Power source 340 may include a filter, a power supply, and a number of other electrical components. Additionally, a DC power supply 360 may be coupled with the electrode 335, and may be configured to provide a chucking voltage.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power and/or RF power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrode 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges.

Figure 4:
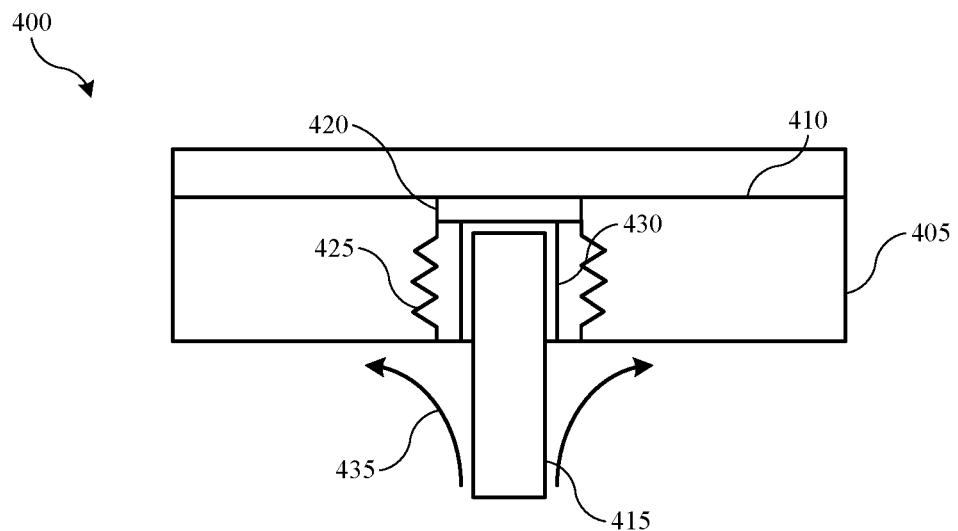
FIG. 4 shows a schematic partial cross-sectional view of an exemplary substrate support assembly according to some embodiments of the present technology.

FIG. 4 shows a schematic partial cross-sectional view of an exemplary substrate support assembly 400 according to some embodiments of the present technology. Substrate support assembly 400 may include any of the materials or components previously described, and may illustrate additional details of substrate support assemblies previously discussed, including support assembly 310 described above. As illustrated, a chuck body 405 may include an embedded electrode 410 as previously described. A power transmission rod 415 may extend into the chuck body 405, and may be coupled with one or more power supplies as previously described. For example, the power transmission rod 415 may be coupled with one or both of a DC power supply, which may be used to electrostatically chuck a substrate, as well as an RF power supply, which may be used in plasma generation or tuning.

Although a heater AC power supply rod may be nickel in some embodiments of the present technology, the power transmission rod 415 may not be nickel. Because of the issues described above, a substrate support that may be operated at higher processing temperatures may be more prone to damage from a nickel power transmission rod, as well as increased heat generation within the substrate support where the rod may be seated. The chuck body 405 may be formed of a ceramic or dielectric material as described above, and in one non-limiting example, may be formed of or include aluminum nitride. At room temperature, aluminum nitride may be characterized by a coefficient of thermal expansion of less than $4 \times 10^{-6}/°$ C., and the property may only extend marginally above $5 \times 10^{-6}/°$ C. at temperatures of 500° C. or higher. Nickel, however, may be characterized by a coefficient of thermal expansion of greater than or about $13 \times 10^{-6}/°$ C. Accordingly, when seated within an aluminum nitride or other ceramic chuck body, the rod may increase stress interactions between the materials, which may lead to damage to either component including cracking of the chuck body.

Accordingly, in some embodiments the power transmission rod may be or include a refractory metal, which may be characterized by a coefficient of thermal expansion of less than or about $12 \times 10^{-6}/°$ C., and may be characterized by a coefficient of thermal expansion of less than or about $10 \times 10^{-6}/°$ C., less than or about $9 \times 10^{-6}/°$ C., less than or about $8 \times 10^{-6}/°$ C., less than or about $7 \times 10^{-6}/°$ C., less than or about $6.8 \times 10^{-6}/°$ C., less than or about $6.6 \times 10^{-6}/°$ C., less than or about $6.4 \times 10^{-6}/°$ C., less than or about $6.2 \times 10^{-6}/°$ C., less than or about $6.0 \times 10^{-6}/°$ C., less than or about $5.8 \times 10^{-6}/°$ C., less than or about $5.6 \times 10^{-6}/°$ C., less than or about $5.4 \times 10^{-6}/°$ C., less than or about $5.2 \times 10^{-6}/°$ C., less than or about $5.0 \times 10^{-6}/°$ C., or less. By utilizing a material characterized by a coefficient of thermal expansion closer to that of aluminum nitride, lower stress effects may occur between the power transmission rod and the substrate support.

The power transmission rod may also be characterized by a resistivity that may limit additional temperature rise when current is delivered along the rod. For example, the RF power delivered may be over 1000 W at over 20 amps of current. To limit temperature rises from this operation that may lead to hot spots forming at the substrate surface, the power transmission rod may be or include materials characterized by a resistivity of less than or about $15 \times 10^{-8}$ Ω-m, and may be characterized by a resistivity of less than or about $13 \times 10^{-8}$ Ω-m, less than or about $10 \times 10^{-8}$ Ω-m, less than or about $9 \times 10^{-8}$ Ω-m, less than or about $8 \times 10^{-8}$ Ω-m, less than or about $7.5 \times 10^{-8}$ Ω-m, less than or about $7.0 \times 10^{-8}$ Ω-m, less than or about $6.8 \times 10^{-8}$ Ω-m, less than or about $6.6 \times 10^{-8}$ Ω-m, less than or about $6.4 \times 10^{-8}$ Ω-m, less than or about $6.2 \times 10^{-8}$ Ω-m, less than or about $6.0 \times 10^{-8}$ Ω-m, less than or about $5.8 \times 10^{-8}$ Ω-m, less than or about $5.6 \times 10^{-8}$ Ω-m, less than or about $5.4 \times 10^{-8}$ Ω-m, less than or about $5.2 \times 10^{-8}$ Ω-m, less than or about $5.0 \times 10^{-8}$ Ω-m, less than or about $4.8 \times 10^{-8}$ Ω-m, less than or about $4.6 \times 10^{-8}$ Ω-m, less than or about $4.4 \times 10^{-8}$ Ω-m, less than or about $4.2 \times 10^{-8}$ Ω-m, less than or about $4.0 \times 10^{-8}$ Ω-m, less than or about $3.8 \times 10^{-8}$ Ω-m, less than or about $3.6 \times 10^{-8}$ Ω-m, less than or about $3.4 \times 10^{-8}$ Ω-m, less than or about $3.2 \times 10^{-8}$ Ω-m, or less.

As noted above, the power transmission rod may be formed of or include one or more refractory metals or an alloy of a refractory metal. For example, any refractory metal may be used including tungsten, molybdenum, niobium, tantalum, or any other refractory metal. Alloys may be used to further tune electrical and thermal characteristics of the power transmission rod. For example, either the coefficient of thermal expansion or the resistivity may be tuned by alloying a refractory metal with an additional metal. In one non-limiting example, tungsten may be alloyed with copper, which may reduce resistivity with increasing copper concentration. Accordingly, continuing the example, the copper percentage of the alloy may be greater than or about 10%, and may be greater than or about 15%, greater than or about 20%, greater than or about 25%, greater than or about 30%, greater than or about 35%, greater than or about 40%, greater than or about 45%, greater than or about 50%, or higher. However, as the percentage of copper increases, the coefficient of thermal expansion may increase as well. Accordingly, in some embodiments the copper percentage of the alloy may be maintained at less than or about 60%, and may be maintained at less than or about 55%, less than or about 50%, less than or about 45%, less than or about 40%, less than or about 35%, less than or about 30%, or less. It is to be understood that the example is not limiting, and a number of other alloys that may allow tuning of the refractory metal are similarly encompassed by the present technology.

By utilizing refractory metals, improved performance at higher operating temperatures may be afforded. However, to accommodate the metal of the rod, additional components of the coupling may be modified. For example, as illustrated in FIG. 4, a terminal 420 may be included that couples the power transmission rod 415 with the electrode 410. The terminal 420 may also be a refractory metal, such as any of the refractory metal noted above, including molybdenum in one non-limiting example. An eyelet 425 may be included and seated against the terminal 420 to facilitate coupling. The eyelet may be made of any material, including refractory materials, and in some embodiments the eyelet may be formed of the same material as the power transmission rod.

The power transmission rod 415 may be bonded, sealed, brazed, or otherwise coupled within the eyelet 425. A material 430 may be used to seat and electrically couple the power transmission rod within the structure. For example, a brazing material may be used that may accommodate the material of the power transmission rod. The material 430 may include any number of transition metals in some embodiments, and may include compounds of multiple transition metals, which may include any number of transition metals in embodiments of the present technology. Compound materials may include one or more precious metals, including palladium, silver, gold, or platinum, as well as combinations of these materials. Additional brazing materials may include one or more other transition metals, such as one or more Group 4 or Group 5 elements. For example, the material may include one or more of titanium, zirconium, hafnium, vanadium, niobium, tantalum, or combinations of these materials. As one example, a material may include one or more of titanium, zirconium, or vanadium in any combination, including relatively equal parts, for example.

In some embodiments a purge fluid 435 may be flowed along the power transmission rod 415 up through the pedestal, such as through stem 330 as previously described. Because atmospheric conditions may be maintained or occur within the pedestal stem, the power transmission rod may be exposed to oxygen or water vapor, which may cause oxidation or other effects along the rod. Accordingly, the rod may be maintained within a holder, or open within the pedestal stem, and a purge fluid may be flowed up through the stem or within the holder volume to purge air or other oxygen from the system. For example, nitrogen, argon, helium, or any other fluid may be flowed up through the pedestal shaft to purge oxygen-containing materials from about the power transmission rod. By utilizing specific materials and power transmission rods according to embodiments of the present technology, improved RF power delivery may be provided. Additionally, process uniformity may be improved by limiting heat generation from the power transmission rod within a specific location in the substrate support.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the rod" includes reference to one or more rods and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly comprising:
an electrostatic chuck body defining a substrate support surface, the electrostatic chuck body defining a recess;
a support stem coupled with the electrostatic chuck body;
a heater embedded within the electrostatic chuck body; and
an electrode embedded within the electrostatic chuck body between the heater and the substrate support surface;
a power transmission rod disposed within the recess and coupled with the electrode, wherein the power transmission rod comprises a material characterized by a coefficient of thermal expansion of less than or about $10 \times 10^{-6}/°$ C., wherein the material comprises tantalum, an alloy of tantalum, or a tungsten-copper alloy;
a terminal seated within the recess and coupling the power transmission rod with the electrode, wherein the terminal comprises molybdenum;
a cylindrical eyelet seated against the terminal within the recess, wherein:
the eyelet forms a receptacle for the power transmission rod; and
the eyelet comprises a refractory metal; and
a brazing material joining the power transmission rod with the eyelet and the terminal, the brazing material comprising a transition metal.

2. The substrate support assembly of claim 1, wherein the power transmission rod is characterized by a room temperature resistivity of less than or about $15 \times 10^{-8}$ Ω-m.

3. The substrate support assembly of claim 1, wherein the tungsten-copper alloy is characterized by a copper concentration of less than or about 50%.

4. The substrate support assembly of claim 1, wherein the brazing material comprises an alloy including one or more Group 4 or Group 5 metals.

5. The substrate support assembly of claim 1, wherein the support stem defines a volume about the power transmission rod that is configured to receive a purge fluid that is flowed along the power transmission rod.

6. The substrate support assembly of claim 5, wherein the purge fluid comprises at least one of nitrogen, argon, or helium.

7. The substrate support assembly of claim 1, further comprising a holder that is disposed within the support stem and that receives a portion of the power transmission rod, wherein the holder defines a volume about the power transmission rod that is configured to receive a purge fluid that is flowed along the power transmission rod.

8. The substrate support assembly of claim 7, wherein the purge fluid comprises at least one of nitrogen, argon, or helium.

9. A substrate support assembly comprising:
a support body defining a substrate support surface, the support body defining a recess;
a heater embedded within the support body;
an electrode embedded within the support body,
a power transmission rod disposed within the recess, the power transmission rod comprising tantalum or a tungsten copper alloy;
a terminal seated within the recess and coupling the power transmission rod with the electrode;
a cylindrical eyelet seated against the terminal within the recess, wherein:
the eyelet forms a receptacle for the power transmission rod; and
the eyelet comprises a refractory metal; and
a brazing material joining the power transmission rod with the eyelet and the terminal, the brazing material comprising a transition metal, wherein the power transmission rod is characterized by a room temperature resistivity of less than or about $5 \times 10^{-8}$ Ω-m.

10. The substrate support assembly of claim 9, wherein the terminal comprises molybdenum.

11. The substrate support assembly of claim 9, wherein the power transmission rod comprises a material characterized by a coefficient of thermal expansion of less than or about $6 \times 10^{-6}/°$ C.

12. The substrate support assembly of claim 9, wherein the power transmission rod is characterized by a room temperature resistivity of less than or about $4 \times 10^{-8}$ Ω-m.

13. The substrate support assembly of claim 9, wherein the tungsten-copper alloy is characterized by a copper concentration of less than or about 50%.

14. The substrate support assembly of claim 9, wherein the brazing material comprises an alloy including one or more Group 4 or Group 5 metals.

15. A substrate support assembly comprising:
an electrostatic chuck body defining a substrate support surface, the electrostatic chuck body defining a recess;
a heater embedded within the electrostatic chuck body;
an electrode embedded within the electrostatic chuck body;
a power transmission rod disposed within the recess, the power transmission rod comprising tantalum or a tungsten-copper alloy;
a terminal seated within the recess and coupling the power transmission rod with the electrode;
a cylindrical eyelet seated against the terminal within the recess, wherein:
the eyelet forms a receptacle for the power transmission rod; and
the eyelet comprises a refractory metal; and
a brazing material joining the power transmission rod with the terminal and the eyelet, wherein the brazing material comprises an alloy comprising one or more of zirconium and vanadium.

16. The substrate support assembly of claim 15, wherein the power transmission rod comprises a material characterized by a coefficient of thermal expansion of less than or about $7\times10^{-6}/°$ C.

\* \* \* \* \*